United States Patent
Shields

[19]
[11] Patent Number: 6,010,965
[45] Date of Patent: Jan. 4, 2000

[54] METHOD OF FORMING HIGH INTEGRITY VIAS

[75] Inventor: Jeffrey A. Shields, Sunnyvale, Calif.

[73] Assignee: Advanced Micro Devices, Inc., Sunnyvale, Calif.

[21] Appl. No.: 08/992,959

[22] Filed: Dec. 18, 1997

[51] Int. Cl.[7] .................................................. H01L 21/465
[52] U.S. Cl. ........................ 438/700; 438/702; 438/706; 438/710; 438/714
[58] Field of Search .................................. 438/700, 690, 438/702, 695, 701, 710, 706

[56] References Cited

U.S. PATENT DOCUMENTS

| | | |
|---|---|---|
| 4,944,682 | 7/1990 | Cronin et al. ............................ 437/192 |
| 5,232,872 | 8/1993 | Ohba ........................................ 437/192 |
| 5,484,747 | 1/1996 | Chien ....................................... 437/190 |
| 5,726,100 | 3/1998 | Givens ..................................... 438/702 |
| 5,783,485 | 7/1998 | Ong et al. ................................ 438/700 |
| 5,795,825 | 8/1998 | Sugano et al. .......................... 438/700 |

*Primary Examiner*—Benjamin Utech
*Assistant Examiner*—Duy-Vu Deo

[57] ABSTRACT

Aluminum extrusions in overlying vias are prevented by depositing the underlying aluminum layer at a high temperature, preferably at a temperature greater than any temperature to which the wafer is exposed during subsequent processing. Embodiments include sputter depositing the underlying aluminum layer at a temperature of about 430° C. to about 570° C.

15 Claims, 1 Drawing Sheet

METHOD OF FORMING HIGH INTEGRITY VIAS

TECHNICAL FIELD

The present invention relates to a method of manufacturing a high density, multi-metal layer semiconductor device having a reliable interconnection pattern. The invention has particular applicability in manufacturing high density multi level semiconductor devices with design features of 0.25 microns and under.

BACKGROUND ART

The escalating demands for high densification and performance associated with ultra-large scale integration semiconductor devices require design features of about 0.25 microns and under, such as about 0.18 microns, increased transistor and circuit speeds, high reliability and increased manufacturing throughput. The reduction of design features to 0.25 microns and under challenges the limitations of conventional interconnection technology.

Conventional methodology for forming patterned metal layers comprises a subtractive etching or etch back step as the primary metal patterning technique. Such a method involves the formation of a first dielectric layer on a substrate, typically a semiconductor substrate comprising doped monocrystalline silicon, with contacts formed in the first dielectric layer for electrical connection with an active region on the substrate, such as a source/drain region. A metal layer, such as aluminum or an aluminum alloy, is deposited on the first dielectric layer, typically by sputter deposition. Aluminum and aluminum alloy layers are typically sputter deposited at a temperature of about 50 to about 500° C. A photoresist mask is then formed on the metal layer having a pattern corresponding to a desired conductive pattern. The metal layer is then etched through the photoresist mask to form the conductive pattern comprising metal features. A second dielectric layer, such as spin-on-glass (SOG) or hydrogen silsesquioxane (HSQ), is deposited to fill the gaps between the metal features. A third dielectric layer, e.g., oxide layer, such as silicon dioxide derived from tetraethyl orthosilicate (TEOS) by plasma enhanced chemical vapor deposition (PECVD) or silicon dioxide derived from silane by PECVD, is then deposited and planarized as by chemical mechanical polishing (CMP). A mask, e.g., a photoresist mask, is then formed on the third dielectric layer and a through-hole is formed in the second and third dielectric layers, as by anisotropic etching, to expose the underlying first metal feature. The through-hole can be formed such that the underlying first metal feature encloses the entire bottom opening thereof, serving as a landing pad for a metal plug filling the through-hole to form the conductive via. Prior to filling the through-hole, the photoresist mask is stripped, as by employing a combination of an oxygen plasma, is and solvent cleaning, all at elevated temperatures. A barrier metal is then deposited lining the through-hole in contact with the underlying metal feature to provide adhesion between the underlying metal feature and the subsequently deposited metal plug, such as tungsten typically vapor deposited by employing tungsten hexafluoride as a reactant gas.

The reduction in design features to about 0.25 microns and under requires extremely high densification which mandates high aspect ratio (height/width) openings. The conventional practice of forming a landing pad completely enclosing the bottom surface of a conductive via utilizes a significant amount of precious real estate on a semiconductor chip which is antithetic to escalating high densification requirements. It is also extremely difficult to voidlessly fill through-holes having such reduced dimensions because of the extremely high aspect ratios, e.g., in excess of four. Accordingly, conventional approaches also comprise purposely widening the diameter of the through-hole to decrease the aspect ratio which results in misalignment wherein upon the surface of the conductive via is not completely enclosed by the underlying metal feature. This type of via is called a "borderless via," which also conserves the chip real estate.

In forming either conventional landing pad vias or borderless vias, the via opening or through-hole is often designed to stop on a barrier layer formed on the underlying metal layer. Such a barrier layer typically comprises titanium nitride (TiN) which is formed on the underlying aluminum or aluminum alloy layer. However, the TiN layer is etched through or thinned during via etching, thereby exposing the underlying aluminum or aluminum alloy. Upon exposing the chip to higher temperatures during subsequent processing, as during plasma stripping of the photoresist, solvent cleaning, degassing and barrier metal or tungsten deposition, stress is induced which causes the aluminum or aluminum alloy to extrude up through the via through-hole, thereby creating killer defects.

Accordingly, there exists a need for a semiconductor methodology for forming reliable interconnections, particularly interconnections involving underlying aluminum or aluminum alloy features. There exists a particular need for reliable interconnection technology involving underlying aluminum or aluminum alloy features of about 0.50 microns and under.

DISCLOSURE OF THE INVENTION

An object of the present invention is a method of manufacturing a semiconductor device having highly reliable interconnections between underlying aluminum or an aluminum alloy metal features.

Additional objects, advantages and other features of the invention will be set forth in part in the description which follows and in part will become apparent to those having ordinary skill in the art upon examination of the following or may be learned from the practice of the invention. The objects and advantages of the invention may be realized and obtained as particularly pointed out in the appended claims.

According to the present invention, the foregoing and other objects are achieved in part by a semiconductor device, comprising: forming a first dielectric layer on a substrate; depositing a conductive layer comprising aluminum or an aluminum alloy on the first dielectric layer at a first temperature; etching the conductive layer to form a conductive pattern comprising a first metal feature; forming a second dielectric layer on the first metal feature; forming a through-hole in the second dielectric layer exposing a portion of an upper surface of the first metal feature; filling the through-hole with a conductive material to form a via in contact with the first metal feature; forming a second metal feature on the second dielectric layer, in electrical contact with the second metal feature through the via; and forming a third dielectric layer on the second dielectric layer and second metal feature; wherein the first temperature is higher than any temperature employed during processing subsequent to depositing the aluminum or aluminum alloy layer.

Additional objects and advantages of the present invention will become readily apparent to those skilled in this art from the following detailed description, wherein only the preferred embodiment of the invention is shown and described, simply by way of illustration of the best mode contemplated for carrying out the invention. As will be realized, the invention is capable of other and different embodiments, and its several details are capable of modifications in various obvious respects, all without departing from the invention. Accordingly, the drawing and description are to be regarded as illustrative in nature, and not as restrictive.

DESCRIPTION OF THE INVENTION

Figure 1:
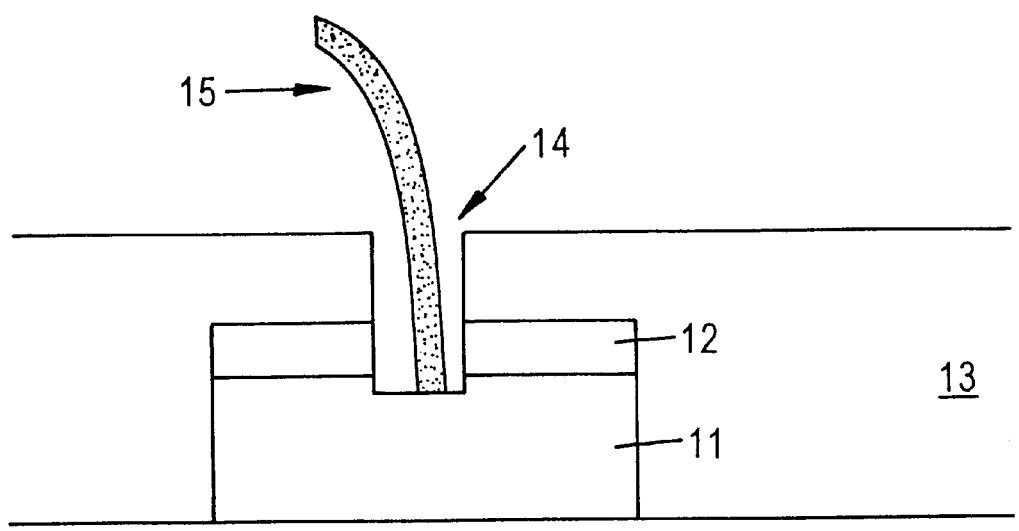
FIG. 1 schematically illustrates an aluminum extrusion problem addressed and solved by the present invention.

The present invention addresses and solves the aluminum or aluminum alloy extrusion problem occurring in vias providing an electrical interconnection with an underlying aluminum or aluminum alloy metal feature, such as a metal line. Adverting to FIG. 1, a metal feature is formed on first dielectric layer 10. The metal feature typically comprises a composite of a primary conductive layer 11 containing aluminum or aluminum alloy and a barrier layer 12 thereon, typically TiN. The aluminum or aluminum alloy is typically sputter deposited at a temperature of about 350° C. A second dielectric layer 13 is formed on first dielectric layer 10 and over the metal feature. Through-hole 14 is then formed in dielectric layer 13 which typically penetrates or thins barrier layer 12 and exposes the underlying aluminum or aluminum alloy layer 11. During subsequent processing, it was found that the aluminum or aluminum alloy extrudes up through the through-hole creating a serious defect. Although such undesirable extrusion occurs more often prior to depositing the plug in the via, it has also been found to occur subsequent to completely filling the through-hole with the metal plug. It is believed that the aluminum or aluminum alloy extrusions are caused by stress induced by thermal processing subsequent to through-hole formation, particularly at a temperature higher than the temperature at which the aluminum or aluminum alloy layer was deposited, e.g., at a temperature greater than about 350° C. Such temperatures are typically employed during various subsequent processing steps, as when removing the photoresist mask employed for forming the through-hole degassing, barrier metal deposition, as well as during filling the through-hole, and subsequent deposition of dielectric layers and overlying metal layers.

Upon extensive experimentation and investigation, it was found that the aluminum or aluminum alloy extrusion problem can be solved by depositing the aluminum or aluminum alloy at a temperature higher than the temperature employed during subsequent processing, before and after filling the through-hole to form the conductive via.

A conventional metal feature is typically formed as a composite structure comprising a lower metal layer of titanium or tungsten, an intermediate or primary conductive layer of aluminum or an aluminum alloy, e.g., an aluminum containing minor amounts, e.g., up to about 10% by weight, of copper, and an anti-reflective coating, such as titanium nitride. The aluminum or aluminum alloy layer is typically sputter deposited at a temperature of about 350° C. A dielectric layer is then deposited typically at a temperature of about 350° C. to about 450° C., and a through-hole formed therein. The photoresist mask is removed, as by employing an oxygen-containing plasma at an elevated temperature. The through-hole is then solvent cleaned and degassed.

During subsequent processing, temperatures in excess of the aluminum or aluminum deposition temperature of about 350° C. are frequently employed, as during plasma treatment, solvent treatment, degassing, barrier metal deposition, and subsequent film depositions. For example, subsequent deposition of dielectric layers typically occurs at a temperature of about 400° C. to about 430° C. It is believed that the stresses induced during subsequent processing at temperatures in excess of the temperature at which the aluminum or aluminum alloy layer was deposited causes the aluminum or aluminum alloy to extrude through the via hole.

The present invention addresses and solves such an extrusion problem by depositing the aluminum or aluminum alloy layer at a temperature higher than any temperature employed during subsequent processing, such as for plasma stripping, solvent cleaning, degassing, barrier metal deposition, plug filling, dielectric layer formation and metal layer formation. The temperatures employed during such subsequent processing steps may be determined, in part, by the particular process and, hence, cannot be reduced to a desirably low level without diminishing the effectiveness of the particular processing step subsequent to aluminum or aluminum alloy deposition. However, the objectives of the present invention can be achieved by ensuring that the temperature during deposition of the aluminum or aluminum alloy layer is higher than that employed during subsequent processing, as by elevating the temperature at which the aluminum or aluminum alloy is deposited. It should be understood that in forming multilevel interconnect patterns, a plurality of aluminum or aluminum alloy layers are deposited separated by dielectric layers. In accordance with the present invention, the first aluminum or aluminum alloy layer is deposited at the highest temperature and, with respect to each subsequently deposited aluminum or aluminum alloy layer, the temperature employed is greater than any temperature employed during subsequent processing.

Embodiments of the present invention include depositing the aluminum or aluminum alloy layer at a temperature up to below the melting point of aluminum, which is about 660° C., or up to below about the melting point of the particular aluminum alloy employed. It has been found suitable to deposit an aluminum or an aluminum layer at a temperature of about 430° C. up to about 570° C., such as about 430° C. to about 470° C., e.g., about 430° C. to about 450° C. It was found that the deposition of the aluminum or aluminum alloy at a temperature greater than the temperature employed during subsequent processing, particularly temperatures employed during subsequent processing prior to completely filling the via with the metal plug, e.g., during $O_2$ plasma treatment for resist removal, solvent treatment, degassing and barrier layer deposition, avoids the extrusion problem encountered in vias overlying aluminum or aluminum alloy metal features, particularly when the barrier layer is penetrated during etching to form the through-hole thereby exposing the underlying aluminum or aluminum alloy.

In accordance with embodiments of the present invention, a first dielectric layer is deposited on a substrate. The first dielectric layer and substrate are formed in accordance with conventional practices, the first dielectric layer typically comprising silicon dioxide. A composite conductive layer is formed comprising a first layer of tungsten or titanium, a primary conductive layer of aluminum or aluminum alloy and an overlying barrier layer, such as titanium nitride. In accordance with the present invention, the primary conductive layer comprising aluminum or aluminum alloy is deposited, as by sputter deposition, at a temperature higher than the temperature employed during subsequent processing, particularly during subsequent processing prior to completely filling the through-hole with a metal plug, such as the temperatures employed during oxygen plasma resist removal, solvent cleaning, degassing and barrier metal deposition. The present invention also comprises depositing the primary conductive layer of aluminum or aluminum alloy at a temperature higher than the temperature employed during subsequent processing to which the chip is exposed. Embodiments of the present invention including sputter depositing an aluminum or an aluminum layer at a temperature of about 430° C. to about the melting point of aluminum or the aluminum alloy, such as about 430° C. to about 570° C., e.g., about 430° C. to about 450° C.

The conductive layer is then etched to form a conductive pattern comprising a plurality of metal features, such as metal lines having gaps therebetween. A conventional gap filling oxide is then deposited, e.g., spin-on-glass (SOG) or hydrogen silsesquioxane (HSQ) is then deposited. A layer of silicon dioxide, such as derived from TEOS or silane, is then deposited and planarization is effected, as by CMP. A photoresist mask is formed on the planarized surface. The photoresist mask contains an opening defining a through-hole to be formed in the underlying dielectric layer. A through-hole is then formed exposing a portion of the upper surface of the conductive layer, possibly penetrating the TiN barrier layer, thereby exposing the aluminum or aluminum alloy primary conductive material. The through-hole can be formed with a bottom portion completely enclosed by the underlying metal feature, e.g., to form a conventional landing pad via. The through-hole can also be formed overlapping the upper surface of the metal feature for forming a borderless via.

After forming the through-hole, the photoresist mask is removed, as by employing an $O_2$ plasma, and the through-hole is solvent cleaned and degassed. A barrier metal layer is then deposited in the through-hole to ensure adhesion of the subsequently deposited tungsten layer. The plasma etching technique to remove the photoresist mask, solvent cleaning, degassing and barrier metal deposition, are conducted in accordance with conventional practices; however, the temperature employed for sputter depositing the aluminum or aluminum alloy layer is minimized when possible without diminishing the efficiency of the particular procedure.

The through-hole is then filled, as with tungsten. Subsequently, a plurality of dielectric interlayers and metal layers are formed and interconnection patterns implemented. Such subsequent processing step is also conducted in accordance with conventional practices; however, the temperature employed for each subsequent technique is less than the temperature employed during sputter deposition of the aluminum or aluminum layer, minimized when possible without diminishing the efficacy of the particular procedure. Any subsequently formed aluminum and aluminum alloy layers are formed at a temperature below the temperature employed for depositing an underlying aluminum or aluminum alloy layer but above the temperature employed during processing subsequent to that particular aluminum or aluminum alloy layer.

The barrier layer deposited in accordance with the present invention can comprise a material conventionally employed for that purpose in manufacturing semiconductor devices, e.g., titanium-nitride, titanium-tungsten, titanium or titanium-nitride. Through-holes in accordance with the present invention can be filled with the primary conductive metal, such as tungsten, in a conventional manner, as by chemical vapor deposition employing tungsten hexafluoride.

The present invention is applicable to the production of various types of semiconductor devices, particularly ultra high density, multi-metal patterned layers, sub-micron features of 0.50 microns and below, exhibiting high speed characteristics and improved interconnection reliability. The present invention is cost effective and can easily be integrated into conventional processing.

In the previous descriptions, numerous specific details are set forth, such as specific materials, structures, chemicals, processes, parameters, etc., in order to provide a thorough understanding of the present invention. However, the present invention can be practiced without resorting to the details specifically set forth. In other instances, well known processing structures have not been described in detail, in order not to unnecessarily obscure the present invention.

Only the preferred embodiment of the invention and but a few examples of its versatility are shown and described in the present disclosure. It is to be understood that the invention is capable of use in various other combinations and environments and is capable of changes or modifications within the scope of the inventive concept as expressed herein.

What is claimed is:

1. A method of manufacturing a semiconductor device, which method comprises:

forming a first dielectric layer on a substrate;

depositing a conductive layer comprising aluminum or an aluminum alloy on the first dielectric layer at a first temperature;

etching the conductive layer to form a conductive pattern comprising a first metal line;

forming a second dielectric layer on the first metal line;

forming a through-hole in the second dielectric layer exposing a portion of an upper surface of the first metal line;

filling the through-hole with a conductive material to form a via in contact with the first metal line;

forming a second metal line on the second dielectric layer in electrical contact with the first metal line through the via; and forming a third dielectric layer on the second dielectric layer and second metal line; wherein the first temperature is higher than any temperature employed during processing subsequent to depositing the aluminum or an aluminum alloy layer, and each aluminum or aluminum alloy layer is deposited at a temperature higher than any subsequent processing temperature.

2. The method according to claim 1, wherein conductive layer comprises a barrier layer on the layer of aluminum or aluminum alloy.

3. The method according to claim 2, wherein the first temperature is about 430° C. to below the melting point of aluminum or the aluminum alloy.

4. The method according to claim 3, wherein the first temperature is about 430° C. to about 570° C.

5. The method according to claim 4, wherein the first temperature is about 430° C. to about 450° C.

6. The method according to claim 5, wherein the first conductive line is a composite comprising a first layer of titanium or tungsten, a second layer of aluminum or an aluminum alloy and a third layer of titanium nitride.

7. The method according to claim 2, further comprising:

forming a photoresist mask on the second dielectric layer having an opening defining the through-hole;

etching the second dielectric layer to form the through-hole;

removing the photoresist mask employing a plasma;

solvent cleaning the through-hole;

degassing the through-hole; and depositing a barrier layer lining the through-hole before filling the through-hole with a metal, wherein each of the plasma treatment, solvent treatment, degassing and barrier metal deposition is conducted at a temperature less than the first temperature.

8. The method according to claim 7, wherein the barrier layer comprises titanium nitride.

9. The method according to claim 8, wherein the through-hole penetrates the titanium nitride barrier layer exposing the underlying aluminum or aluminum alloy layer.

10. The method according to claim 2, wherein the via is filled with a composite comprising a first conductive barrier layer which acts as an adhesion promoter for a second conductive layer.

11. The method according to claim 10, wherein the first layer comprises titanium, titanium nitride, titanium-tungsten or titanium-titanium nitride, and the second layer comprises tungsten or an alloy of tungsten.

12. The method according to claim 2, wherein the layer of aluminum or aluminum alloy is sputter deposited.

13. The method according to claim 1, wherein the entire bottom surface of the via is on the upper surface of the first metal line.

14. The method according to claim 1, wherein a portion of the via overlaps a portion of the first metal line forming a borderless via.

15. The method according to claim 1, comprising sequentially depositing a plurality of aluminum or aluminum alloy layers, patterning the layers to form a plurality of lines in each layer, wherein each aluminum or aluminum alloy layer is deposited at a temperature higher than that employed when depositing any subsequent aluminum or aluminum alloy layers.

* * * * *